United States Patent [19]

Kane

[11] 4,134,124

[45] Jan. 9, 1979

[54] SEMICONDUCTOR DEVICES AND CIRCUIT ARRANGEMENTS INCLUDING SUCH DEVICES

[75] Inventor: Jeffrey Kane, Cheadle Hulme, England

[73] Assignee: Ferranti Limited, Hollinwood, England

[21] Appl. No.: 855,257

[22] Filed: Nov. 28, 1977

[51] Int. Cl.² .................................... H01L 27/04
[52] U.S. Cl. ............................ 357/48; 357/34; 357/36; 357/45; 357/51; 357/53
[58] Field of Search ................ 357/34, 36, 45, 48, 357/51, 53

[56] References Cited

U.S. PATENT DOCUMENTS 3,971,059  7/1976  Dunkley et al. ................. 357/91

*Primary Examiner*—Edward J. Wojciechowicz
*Attorney, Agent, or Firm*—Cameron, Kerkam, Sutton, Stowell & Stowell

[57] ABSTRACT

A circuit arrangement is at least partially embodied in a collector-diffusion-isolation (CDI) type device, in a semiconductor body comprising a thin layer initially wholly of one conductivity type on a substrate of the same conductivity type, and the device has a plurality of CDI-type components, each CDI-type component with a combination of regions of the opposite conductivity type, comprising a buried layer at the interface between the thin layer and the substrate, and an isolation barrier for the component extending through the thin layer to contact the buried layer, the circuit arrangement being such that no constituent component of the device breaks down when a potential difference of up to substantially twice the breakdown potential of the outer P-N junction of each CDI-type component, and at least of 10 volts, is applied across the device. Usually the substrate of the body is at the most negative potential level associated with the device. In one circuit arrangement the most positive potential level associated with the device is applied to the emitter (in the forward mode) of a CDI bipolar transistor arranged to operate in the inverse mode. Alternatively, the most positive potential level is applied to one end of a novel, high-voltage breakdown CDI-type component comprising a resistor structure, the resistive material comprising an inner surface region of the opposite conductivity type, within a region of said one conductivity type of the thin layer and defined by the combination of regions. In another circuit arrangement, the most positive potential level is applied to a novel, high-voltage breakdown CDI-type component comprising a contact structure having a contact on a layer of passivating material and overlaying an inner surface region of the component as referred to above. In yet another circuit arrangement, the most positive potential level is applied to a novel, high-voltage breakdown CDI-type component having only one contact, the contact being provided on an inner surface region of the component as referred to above.

40 Claims, 15 Drawing Figures

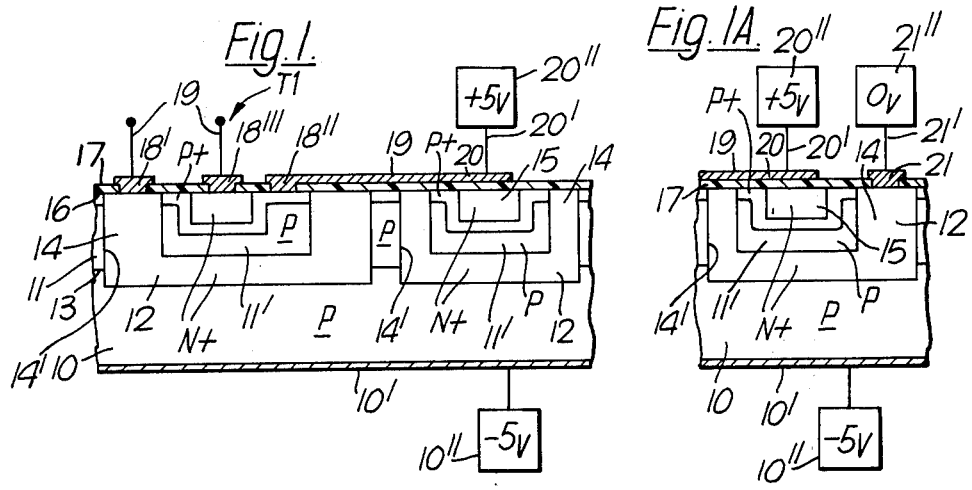
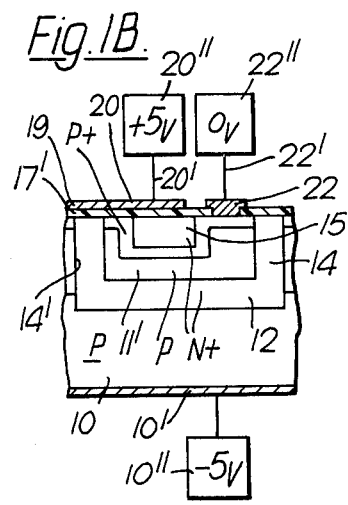
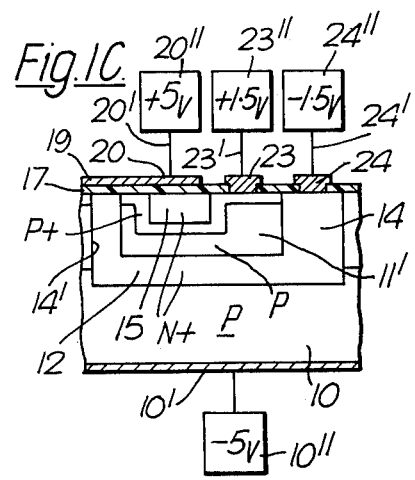
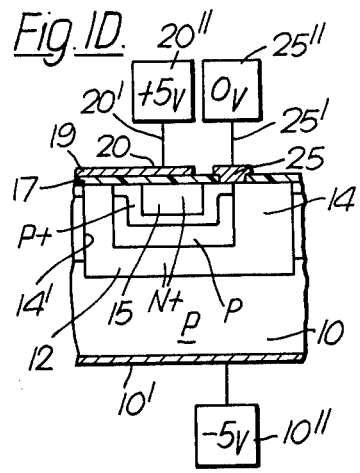
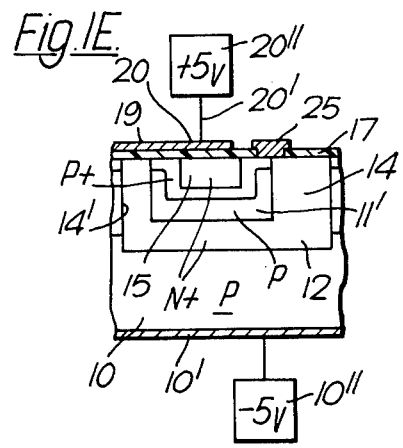

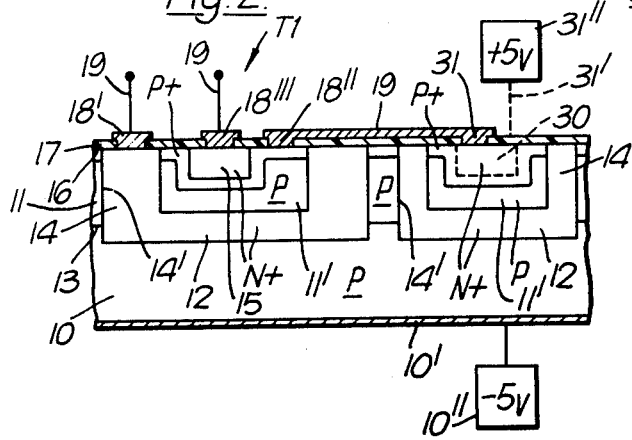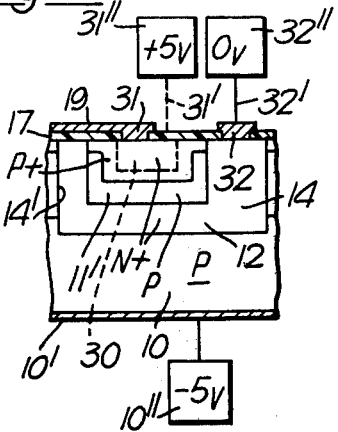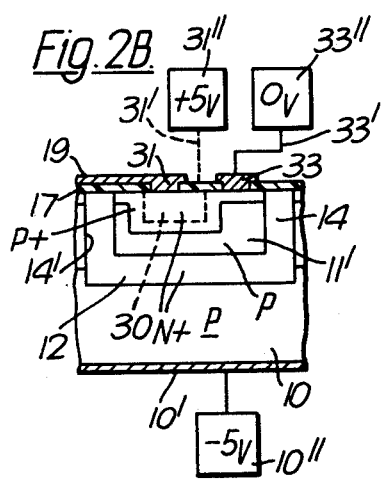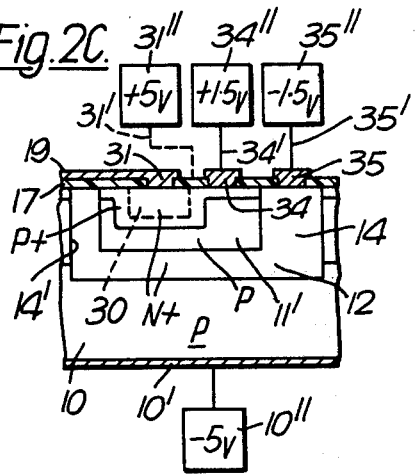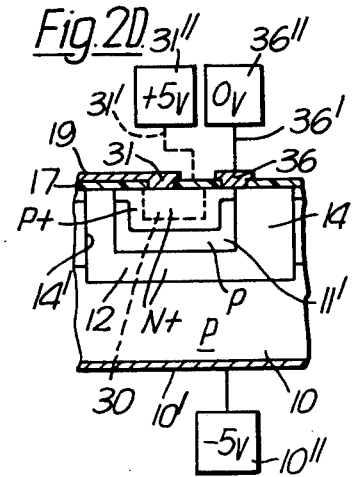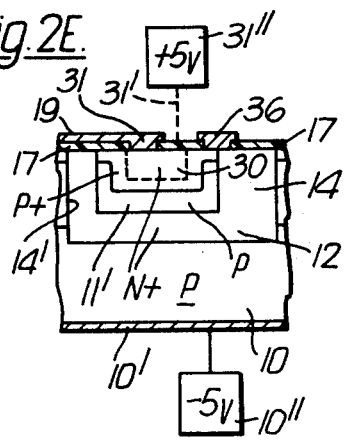

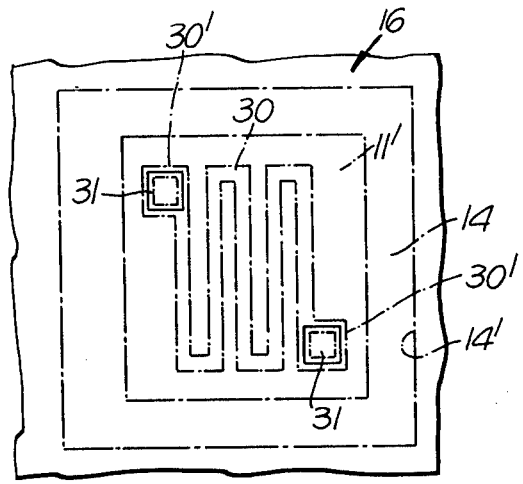
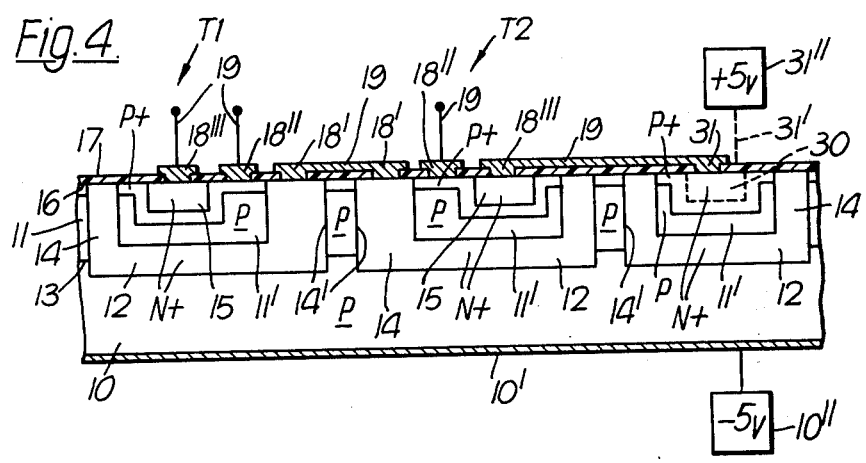
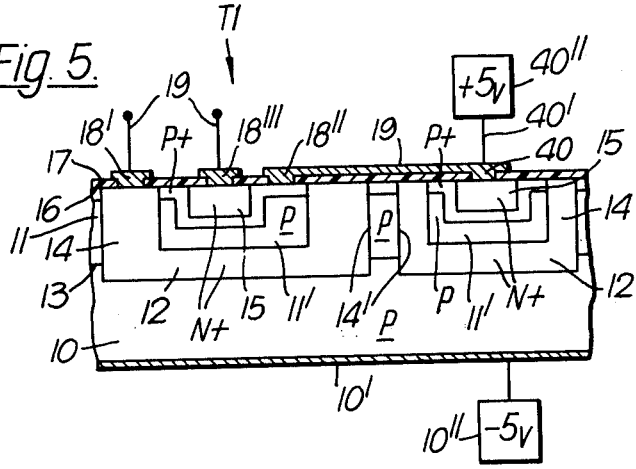

SEMICONDUCTOR DEVICES AND CIRCUIT ARRANGEMENTS INCLUDING SUCH DEVICES

THIS INVENTION relates to semiconductor devices, and to circuit arrangements including such devices, and in particularly to devices each in a semiconductor body initially wholly comprising a thin layer of one conductivity type on a substrate of the same conductivity type, the device having a plurality of constituent components each with a combination of regions comprising a buried layer of the opposite conductivity type at a portion of the interface between the thin layer and the substrate and an isolation barrier of the opposite conducitivy type for the component, the isolation barrier extending through the thin layer to the buried layer, and at least one component also having an inner region of the opposite conductivity type within the region of said one conductivity type defined by the combination of regions, the inner region of the opposite conductivity type being adjacent to the surface of the thin layer remote from the substrate and being spaced from the combination of regions, within the device said plurality of constituent components being spaced from each other within the thin layer and being substantially electrically isolated from each other within the semiconductor body by regions of the device, of said one conductivity type, and beyond each component, but contiguous with the outer P-N junction serving partially to define the combination of regions of each component.

A known collector-diffusion-isolation (CDI) bipolar transistor construction comprises such a component. The known CDI bipolar transistor is provided in a semiconductor body initially wholly comprising a thin epitaxial layer on a substrate of the same conductivity type, the collector comprising the combination of the buried layer and the isolation barrier, the collector defining a base of unmodified epitaxial material, and an emitter of the opposite conductivity type being provided within the base and adjacent to the surface of the epitaxial layer remote from the substrate. Contacts are provided on said surface to at least the base, and possibly also to emitter. Other types of CDI type component can have closely resembling constructions to that of the known CDI bipolar transistor construction, such as a field-effect transistor, and a resistor having resistive material comprising the region of the component of said one conducitivy type, and defined by the combination of the buried layer and the isolation barrier, and irrespective of whether, the component has an inner region of the opposite conducivity type, or not. For convenience, in this specification any component having a construction closely resembling the known CDI bipolar transistor construction will be referred to as a CDI-type component of the known construction. This is irrespective of whether or not the thin layer comprises an epitaxial layer, or whether or not the region of said one conductivity type defined by the combination of regions is of unmodified material of the thin layer. In particular, contacts are provided on said surface to at least the region of said one conductivity type defined by the combination of regions, and possibly also to the inner region of the opposite conductivity type.

CDI-type components of the known construction, including bipolar transistors may be provided by the same processing steps as are required to form the known CDI bipolar transistor construction. Further, in a monolithic semiconductor body a plurality of different CDI-type components of the known construction may be provided simultaneously by the same processing steps as are required to form the known CDI bipolar transistor construction. These processing steps are advantageous in forming a semiconductor device, particularly a device including bipolar transistors, because they are fewer in number than the processing steps required to provide some other known forms of bipolar transistor, each CDI bipolar transistor occupies a smaller part of the contact-bearing surface of the semiconductor body of the device than some other known forms of bipolar transistor and hence the manufacturing yields are higher.

CDI bipolar transistors are also advantageous because they have high inverse current gain factors, greater than 10. For convenience, in this specification the terms "collector" and "emitter" will be used to refer to these parts of a transistor when operating in the forward mode irrespective of whether the transistor is operating in the forward or the inverse mode.

Within any component, of any construction, portions of a P-N junction adjacent to a surface of a semiconductor body of the device breakdown when a lower potential difference is applied across them compared with the breakdown potential difference of portions of the same P-N junction remote from the surfaces of the semiconductor body. Consequently, it is possible to consider that only the portions of a P-N junction adjacent to a surface of the semiconductor body tend to breakdown. This is especially so for CDI-type components of the known construction because it is conventional in their manufacture to provide, in a non-selective diffusion process step before the emitter diffusion process step, heavily doped portions of said one conductivity type adjacent to the surface of the thin layer remote from the substrate, and within all the regions of the thin layer of said one conductivity type. Such heavily doped surface portions are advantageous because, inter alia, they are not likely to change inadvertently their conductivity type, and they surround within the semiconductor body the emitters of CDI bipolar transistors of the device so that the gain-bandwidth product of the transistors is increased. However, the presence of the heavily doped surface portions of said one conductivity type causes the breakdown potential difference of surface portions of P-N junctions of the device to be lower than otherwise would be the case.

Whilst the breakdown characteristics of each P-N junction of a CDI-type component are substantially identical, it is usual for the circuit arrangement including, for example, CDI-type components of the known construction to be such that the internal P-N junctions within the components do not breakdown and, for convenience, in this specification such an assumption will be made, generally it being possible easily to obtain this criterion.

A disadvantage of each CDI-type component of the known construction is that the outer P-N junction, serving partially to define the combination of regions comprising the isolation barrier and the buried layer, breaks down when a potential difference is applied across the P-N junction less than that for the breakdown of the corresponding P-N junction of the same component of some different types of construction. Such an outer P-N junction of a CDI-type component of the known construction breaks down when a potential difference of less than 10 volts is applied across the P-N junction.

It is conventional in the operation of a device including, say, NPN CDI transistors of the known construction, for the regions of the device beyond each constituent CDI-type component, and contiguous with each combination of an isolation barrier and a buried layer of such components, to be maintained at a potential level of −5 volts. In some forms of apparatus including the device, it is required that the output of such a device, including CDI-type components of the known construction is to be connected to a point to be maintained at a potential level of +5 volts, for example, such a point comprising a supply rail maintained at this potential level for associated transistor — transistor logic (TTL) devices of the apparatus. However, as indicated above, the outer P-N junction serving partially to define the combination of regions of a CDI-type component of the known construction breaks down when a potential difference of less than 10 volts is applied across the outer P-N junction. Such a breakdown inevitably will occur within known devices each wholly having CDI-type components of the known construction, and in the apparatus referred to above.

It is an object of the present invention to provide a circuit arrangement including a semiconductor device having a plurality of CDI-type components, the circuit arrangement being such that no constituent component of the device breaks down when a potential difference of upto substantially twice the breakdown potential difference of the outer P-N junction of each CDI-type component of the device, and at least of 10 volts, is applied across the device.

Alternatively, or in addition, it is an object of the present invention to provide a semiconductor device having a plurality of CDI-type components, and at least one component having a high-voltage breakdown potential difference associated therewith, of upto substantially twice the breakdown potential difference of the outer P-N junction of each CDI-type component of the device, and of at least 10 volts, this high-voltage breakdown component possibly having a construction comprising a modification of the known construction of CDI-type components, but comprising a CDI-type component formed by the same processing steps as CDI-type components of the known construction, at least one other component of said plurality of CDI-type components of the device comprising a CDI-type component of the known construction, and is operably coupled to said at least one, high-voltage breakdown, component.

According to the present invention, a circuit arrangement, at least partially embodied in a semiconductor device, in a semiconductor body comprising a thin layer intially wholly of one conductivity type on a substrate of the same conductivity type, the device has a plurality of components, at least one component having a combination of regions comprising a buried layer of the opposite conductivity type at a portion of the interface between the thin layer and the substrate, and an isolation barrier of the opposite conductivity type for the component, the isolation barrier extending through the thin layer to the buried layer, and an inner region of the opposite conductivity type within a region of said one conductivity type defined by the combination of regions, the inner region being adjacent to the surface of the thin layer remote from the substrate and being spaced from the combination of regions, and at least one contact provided on said surface of the semiconductor body, said at least one contact overlying the inner region of the opposite conductivity type, and said at least one component is operable coupled to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, within the device said at least one component and said at least one other component being spaced from each other within the thin layer, and being substantially electrically isolated from each other within the semiconductor body by regions of the device, of said one conductivity type, and beyond each such component, but contiguous with the outer P-N junction of the combination of regions of each such component, and the circuit arrangement including means to maintain at least two spaced points of the device at different potential levels, the circuit arrangement being such that a larger, predetermined potential different is applied between said at least one contact of said at least one component, and the regions of the device beyond, and contiguous with, said at least one component, compared with the potential difference provided between the combination of the buried layer and the isolation barrier of said at least one other component operably coupled to said at least one component, and the regions of the device beyond, and contiguous with, said at least one other component.

Said at least one component, and said at least one other component, each comprises a CDI-type component, and may comprise a CDI-type component of the known construction. These components, although operably coupled, may not be directly connected together. In addition, the device may include components which are not CDI-type components.

In the operation of the device, a predetermined potential difference of upto substantially twice the breakdown potential difference of the outer P-N junction of a CDI-type component, and at least of 10 volts, is applied between said at least one contact of said at least one component, and the regions of the device beyond the component and contiguous with the outer P-N junction of the component, without any P-N junction of the component breaking down. Thus, said at least one component comprises a high-voltage breakdown component, usually connected to an input or output of the device.

The circuit arrangement at least partially embodied with the device is required to be such that no constituent component of the device breaks down when a potential difference of upto substantially twice the breakdown potential difference of the outer P-N junction of each constituent CDI-type component, and at least of 10 volts, is applied across the device.

All the circuit arrangement except for sources of potential may be embodied in the device.

Within a CDI-bipolar transistor, and in the operation of such a transistor, breakdown normally occurs from the emitter to the base, and from the collector to the regions of the device beyond the transistor and contiguous with the transistor, including the substrate of the semiconductor body. According to the present invention, the device of the circuit arrangement may include a CDI bipolar transistor, comprising said at least one component of the device, and having a high inverse current gain factor, greater than 10, the circuit arrangement being such that the transistor conducts only in the inverse mode, and a potential difference upto substantially twice the breakdown potential difference of the outer P-N junction of the transistor collector can be applied across the emitter and the regions of the device beyond the transistor, and contiguous with the transistor. Further, means are required whereby the combination of regions, i.e. the collector, of the transistor, and the region of said one conductivity type defined by the combination of regions, i.e.d the base of the transistor, can be at different potential level.

Because the CDI bipolar transistor is operating in the inverse mode the potential level of the emitter, acting as the collector, conveniently, may have a higher value in relation to the potential level of the substrate of the semiconductor body than when operating in the forward mode.

In addition, it is desirable that a resistor is provided in series with the transistor emitter, to reduce the potential level applied to the emitter, and to reduce breakdown sustaining currents. The resistor may be a constituent CDI-type high-voltage breakdown component of a construction referred to below, of the device; or it may have any convenient construction, and is external of the semiconductor body.

The CDI-type high-voltage breakdown component, or said at least one component, may comprise a modification of a CDI-type component of a known construction as referred to above.

Thus, the high-voltage breakdown CDI-type component, or said at least one component, referred to above, may comprise a contact structure including a metal layer, which, whilst considered to be a contact of the component, the metal layer extends wholly on a layer of passivating material on said surface of the semiconductor body, and is not intended to be in direct contact with the semiconductor body but overlies the inner region of the opposite conductivity type.

Alternatively, the high-voltage breakdown CDI-type component, or said at least one component, referred to above may comprise a resistor structure, the resistive material of which comprises the inner region of the opposite conductivity type, and two contacts are provided to opposite ends of this region. The inner region of the opposite conductivity type may have a zig-zag form when the device is considered in plan.

With each such component also there may be provided a connection between the combination of regions of the component and the region of said one conductivity type defined by the combination of regions, the connection possibly comprising a contact spanning a surface portion of the P-N junction between the regions, this contact possibly being connected to a potential source to be maintained at a predetermined potential level intermediate between the potential level of said at least one contact of said at least one component, and the potential level of the regions of the device beyond the component, and contiguous with the component. If the predetermined potential level is not applied to the regions, the common potential level of these regions is floating. Thus, parasitic four-layer action within such a CDI-type, high-voltage breakdown component is prevented.

In this way, or otherwise, means may be provided whereby at least one of the constituent parts of said at least one of the constituent parts of said at least one component of the device comprising the combination of the buried layer and the isolation barrier, and the region of said one conductivity type defined by the combination of regions, is maintained at a predetermined potential level intermediate between the potential level of said at least one contact of said at least one component, and the potential level of the regions of the device beyond, and contiguous with, said at least one component. The former, predetermined potential level may be substantially mid-way between the latter potential levels. In one such arrangement and the combination of the buried layer and the isolation barrier, and the region of said one conductivity type defined by the combination of regions, of said at least one component, are maintained at the different predetermined potential levels. If the combination of the buried layer and the isolation barrier, and/or the region of said one conductivity type defined by the combination of regions, is not maintained at a predetermined potential level the component part is considered to be floating.

In any event, it is required that the potential level of at least one of the two constituent parts of said at least one component, comprising the combination of regions, and the region of said one conductivity type defined by the combination of regions, is intermediate between the potential level of said at least one contact of said at least one component, and the potential level of the regions of the device beyond, and contiguous with, said at least one component.

In such a circuit arrangement as referred to in the preceding paragraph, another form of CDI-type high-voltage breakdown component, or said at least one component, whilst comprising a modification of a CDI-type component of a known construction, as referred to above, has only one contact, said one contact being in contact with the inner region of the opposite conductivity type, and within the circuit arrangement, means is provided whereby said one contact is maintained at a predetermined potential level, the potential level of the combination of regions, and of the region of said one conductivity type defined by the combination of regions, of said at least one component, being considered to be floating.

According to another aspect the present invention comprises a semiconductor device in which is embodied at least part of a circuit arrangement of any one of the forms referred to above, the device being provided in a semiconductor body comprising a thin layer initially wholly of one conductivity type on a substrate of the same conductivity type, there being embodied within the device said at least one component, and said at least one other component operably coupled to said at least one component.

Said at least one component may comprise a contact structure including a metal layer extending wholly on a layer of passivating material on the surface of the semiconductor body remote from the substrate, the metal layer overlaying the inner region of the opposite conductivity type.

Alternatively, said at least one component comprises a resistor structure, the resistive material of which structure comprises the inner region of the opposite conductivity type, and two contacts are provided to opposing ends of this region, the inner resistive region possibly having a zig-zag form when the device is considered in plan.

In another form, said at least one component has only one contact, said one contact being in contact with the inner region of the opposite conductivity type.

The present invention will now be described by way of example with reference to the accompanying drawings, in which FIG. 1 is a sectional elevation of a semiconductor device having embodied therein part of a circuit arrangement comprising one embodiment according to the present invention, the illustrated part of the device including a CDI bipolar transistor of a known construction, and a CDI-type high-voltage breakdown component comprising a contact structure.

FIGS. 1A thru 1E are sectional elevations of five variations of the high-voltage breakdown component of FIG. 1.

FIG. 2 corresponds to FIG. 1, but shows instead a CDI-type high-voltage breakdown component in the form of a resistor structure.

FIGS. 2A thru 2E are sectional elevations of five variations of the resistor structure of FIG. 2.

FIG. 3 is a plan view of the resistor structure of FIG. 2,

FIG. 4 is a sectional elevation of part of a semiconductor device such as that shown in FIG. 1, or FIG. 2, but the CDI-type high-voltage breakdown component comprises a CDI bipolar transistor arranged to operate in the inverse mode, the device also including a resistor structure of FIGS. 2 and 3 connected to the emitter of the CDI bipolar transistor arranged to operate in the inverse mode, and FIG. 5 is a sectional elevation of part of a semiconductor device such as that shown in FIG. 1, but the CDI-type high-voltage breakdown component comprises a contact structure having only one contact, the contact being in contact with an inner region of the contact structure corresponding to the emitter of the CDI bipolar transistor.

The known NPN collector-diffusion-isolation (CDI) bipolar transistor T1 shown in FIG. 1 is manufactured by known processing steps, and is part of a semiconductor device provided in a silicon semiconductor body comprising a P-type substrate 10 on which is provided a thin, P-type epitaxial layer 11. An N+ type buried layer 12 is provided at a portion of the interface 13 between the substrate 10 and the epitaxial layer 11. An N+ type region 15 is provided adjacent to the surface 16 of the epitaxial layer 11 remote from the substrate, and is spaced from the combination of the buried layer 12 and the isolation barrier 14.

The collector of the transistor comprises the combination of the buried layer 12 and the isolation barrier 14, and is partially defined by an outer P-N junction 14' for the transistor. The base comprises the unmodified region 11' of the P-type epitaxial layer defined by the collector 12, 14. The emitter comprises the inner N+ type region 15, and is defined by a P-N junction 15'.

A silicon oxide passivating layer 17 is provided on the surface 16, the aluminium contacts, comprising metal layers, respectively, 18' to the collector 12, 14, 18'' to the base 11' and 18''' to the emitter 15, are provided through apertures 17' in the passivating layer. Also indicated are electrical connections 19 to the contacts 18', 18'' and 18''', by way of which electrical connections 19, respectively, the collector, the base and the emitter are maintained at the required potential levels when the device is operating. A contact 10' to the substrate 10 is also shown, to indicate that, in operation, the regions 10 and 11 of the device beyond the transistor, and contiguous with the outer P-N junction 14' of the collector, are also maintained by a source 10'' at a required potential level, conventionally this latter potential level being −5 volts.

The contact 18' to the collector 12, 14 may be omitted if the transistor is connected to another component of the device through the semiconductor body.

The device may include other CDI-type components, for example, bipolar transistors, field-effect transistors and resistors, possibly, each having a construction closely resembling that of the known construction for a CDI bipolar transistor T1, a known CDI-type resistor construction having resistive material comprising the unmodified region 11' of P-type epitaxial material. These components closely resembling the illustrated bipolar transistor construction, and including the illustrated bipolar transistor, are referred to as CDI-type components of the known construction, and, in particular, at least one contact is provided to the unmodified region 11', and possibly also to the inner N+ type region 15, if such a region is provided. In addition, the device may also include components which are not CDI-type components.

A circuit arrangement, with the possible exception of potential sources, may be embodied wholly within the device.

CDI-type components, whether of the known construction, or not, are provided by the same processing steps as are required to form the known CDI bipolar transistor T1. Further, in the monolithic semiconductor body a plurality of different CDI-type components, whether of the known construction, or not, are provided simultaneously by the same processing steps as are required to form the known CDI bipolar transistor T1.

Within the device the plurality of constituent CDI-type components are spaced from each other within the epitaxial layer 11, and are substantially electrically isolated from each other within the semiconductor body by regions 10 and 11 of the device, of P-type material, and beyond each component, but contiguous with the outer P-N junction 14' of each component.

Devices having CDI-type components are advantageous, particularly if they have CDI bipolar transistors, because the processing steps in forming the devices are fewer in number than the processing steps required to provide some other known forms of bipolar transistor, each CDI bipolar transistor occupies a smaller part of the contact-bearing surface of the semiconductor body of the device than some other known forms of bipolar transistor, and hence the manufacturing yields are higher.

It is conventional in the manufacture of CDI-type components, including bipolar transistors, to provide in a non-selective diffusion step, before the emitter diffusion step, P+ type surface portions of the unmodified regions of the epitaxial layer of the semiconductor body. Whilst the provision of these P+ type surface portions are not essential they usually are provided because they serve to define the value of any resistor provided in the unmodified regions of the epitaxial layer, help to prevent an inadvertent change of the conductivity type of the surface portions of the unmodified regions of the epitaxial layer, and, because in the completed transistor they surround the emitter, they cause the gain-bandwidth product of the transistor to be increased. However, the pressure of such P+ type surface portions has the effect of reducing the potential differences which cause the P-N junctions of the CDI-type components to breakdown.

Portions of each P-N junction of the device adjacent to the surface 16 of the semiconductor body breakdown when a lower potential difference is applied across them compared with the breakdown potential difference of portions of the same P-N junction remote from the surface 16. Consequently, it is possible to consider that only the portions of a P-N junction adjacent to the surface 16 breakdown.

This is especially so when there are P+ type surface portions provided in the epitaxial layer, by a non-selective diffusion step, as referred to above.

Whilst the breakdown characteristics of each P-N junction of a CDI-type component are substantially identical, it is usual for a circuit arrangement including the components to be such that the internal P-N junctions within the components do not breakdown, generally it being possible easily to obtain this criterion.

A disadvantage of each CDI-type component of the known construction is that the outer P-N junction 14' breaks down when a potential difference is applied across the P-N junction less than that for the breakdown of the corresponding P-N junction of the same component of some different types of construction, i.e. with a potential difference of less than 10 volts. This is especially so when there are P+ type surface portions provided in the epitaxial layer, by a non-selective diffusion step, as referred to above.

As indicated above, conventionally, the P-type regions 10 and 11 of the device, beyond each CDI-type component such as the illustrated NPN bipolar transistor, and contiguous with the outer P-N junction 14' of the component, are maintained at a potential level of −5 volts. However, in some forms of apparatus including the device it is required that the outut or input of such a device, including CDI-type components, is to be connected to a point to be maintained at a potential level of +5 volts, for example, such a point comprising a supply rail for associated TTL devices of the apparatus. Thus, a P-N junction 14' breakdown within a device having CDI-type components of the known construction in the apparatus referred to above, unless precautions are taken.

A circuit arrangement according to the present invention is partially embodied in the semiconductor device, part of which device is shown in FIG. 1. In addition to the CDI bipolar transistor T1 of the known construction, the device includes a CDI-type high-voltage breakdown component comprising a contact structure. Parts of the CDI-type contact structure identical to a closely resembling parts of the transistor T1 are identified by the same reference numerals. The contact structure is formed by the same processing steps as the known CDI bipolar transistor of FIG. 1, and is formed simultaneously in the semiconductor body with the remainder of the plurality of the constituent CDI-type components the contact structure having a construction comprising a modified of the known construction for CDI-type components.

The contact structure differs from the transistor T1 in that a contact 10 overlying the inner N+ type region 15 does not contact the inner region directly, but extends wholly on the layer 17 of passivating material, whilst considered to be a contact of the component. The contact 20 is maintained at a potential level of +5 volts by a source 20" connected to the contact 20 via a connection 20'. Suitable potential levels are applied to the emitter 15 and the base 11' of the transistor T1.

Because contacts are not provided for the combination of regions 12, 14 and the unmodified P-type region 11', in the operation of the device, these regions cannot be maintained directly at any particular potential level, the potential levels of these regions being considered to be floating. A potential difference of upto substantially twice the breakdown potential difference of the outer P-N junction 14', and at least of 10 volts, can be applied between the inner N+ type region 15 of the contact structure and the regions 10 and 11 of the device beyond the component, and contiguous with the outer P-N junction 14', without any P-N junction of the component breaking down.

The contact structure is connected to the base of the transistor T1 via a connection 19. Under normally encountered operating conditions the part of the passivating layer beneath the contact 20 is more likely to breakdown than other parts of the passivating layer, remote from the contact 20. The potential source 10", having an output of −5 volts, is connected to a contact 10' on the substrate 10 of the semiconductor device.

The circuit arrangement is required to be such that no constituent component of the device breaks down when a potential difference of up to substantially twice the breakdown potential difference of the outer component junction 14' is applied across the device.

In particular, within the circuit arrangement, the potential difference between the collector 12, 14 of the transistor T1 and the P type regions of the device beyond the transistor T1, but contiguous with it, is less than the potential difference applied across the construction of the contact structure, and is less than 10 volts, for example, being less than 8 volts.

The suitable potential levels applied to the emitter 15 and the collector 12, 14 of the transmitter T1 may be applied by potential sources (not shown) of the circuit arrangement, or because the transistor T1 is operably coupled to other components of the device.

The contact structure may be varied in several different ways.

In FIG. 1A a contact 21 is provided to the combination of regions 12, 14 of the structure, and the contact 21 is maintained at zero potential by being connected to a potential source 21" via a connection 21'.

In FIG. 1B a contact 22 is provided to the region 11' defined by the combination of regions 12, 14 of the structure, and the contact 22 is maintained at zero potential by being connected to a potential source 22" via a connection 22'.

Thus, in either of the arrangements of FIG. 1A and FIG. 1B one of the two constituent parts of the contact structure comprising the combination of regions 12, 14, and the region 11' defined by the combination of regions, is maintained at a predetermined potential level, substantially mid-way between the potential level of +5 volts of the contact 20, and the potential level of −5 volts of the P-type regions 10, 11 of the device beyond the contact structure, and contiguous with the outer P-N junction 14' serving partially to define the combination of regions 12, 14 of the contact structure. In either arrangement, the constituent part of the device, of said two constituent parts of the device, not maintained at a predetermined potential level, is floating.

As shown in FIG. 1C a contact 23 is provided to the region 11' defined by the combination of regions 12, 14 of the structure, and the contact 23 is maintained at a potential level of +1.5 volt by being connected to a potential source 23" via a connection 23', and a contact 24 is provided to the combination of regions 12, 14, and is maintained at a potential level of −1.5 volt by being connected to a potential source 24" via a connection 24'.

As shown in FIGS. 1D and 1E a contact 25 is provided to both the combination of regions 12, 14, and to the region 11' defined by the combination of regions, of the structure, the contact 25 spanning a surface portion of the P-N junction between the regions, and so that the combination of regions and the region 11' are at the same potential level. Thus, parasitic four-layer action within the structure is prevented. As shown in FIG. 1D the contact 25 is maintained at zero potential by being connected to a potential source 25" via a connection 25'. The contact 25 is shown in FIG. 1E as not being connected to a potential source, and in this circuit arrangement the combination of regions 12, 14, and the region 11', are considered to be floating.

A connection may be provided between the combination of regions 12, 14 and the region 11', other than by providing a contact spanning a surface portion of the P-N junction between these regions.

In any such arrangement it is required that the potential level of at least one of the two constituent parts of the contact structure comprising the combination of regions 12, 14 and the region 11' defined by the combination of regions, is intermediate between the potential level of +5 volts of the contact 20, and the potential level of −5 volts of the P-type regions 10 and 11 of the device beyond the contact structure, and contiguous with the outer P-N junction 14' serving partially to define the combination of regions 12, 14 of the contact structure.

In one particular embodiment of the CDI-type, high-voltage breakdown contact structure the P-N junction defining the inner N+ type region 15 breaks down when a potential difference of at least 7 volts is applied across it. The outer P-N junction 14' breakds down when a potential difference of at least 8 volts is applied across it. Consequently, the breakdown potential difference of the contact structure is at least 15 volts, sufficient for it to be practicable to operate the device with 10 volts applied across it.

As indicated above, the device may have more than the components illustrated. Thus, there may be more than one CDI-type high-voltage breakdown component. A provided CDI-type high-voltage breakdown component may be operably coupled to more than one other CDI-type component, possibly each having the known construction, of the device. A provided CDI-type high-voltage breakdown component, whilst being operably coupled to another CDI-type component of the device, may not be directly connected to the other CDI-type component. The CDI-type high-voltage breakdown component may be operably coupled to a CDI-type component of any form, and possibly not to a CDI bipolar transistor as illustrated.

According to another aspect the present invention comprises a device of any one of the possible constructions referred to above with reference to FIG. 1.

FIG. 2 corresponds to FIG. 1, and parts of the device of FIG. 2 closely resembling, or identical with, parts of FIG. 1 are identified by the same reference numerals in both Figures. The contact structure of FIG. 1, however, is replaced in FIG. 2 by a resistor structure comprising a CDI-type high-voltage breakdown component. Again the resistor structure is formed simultaneously in the semiconductor body as the other constituent CDI-type components of the device, such as the illustrated bipolar transistor T1, but the resistor structure has a construction comprising a modification of the known construction for CDI-type components. A plan view of the resistor structure is shown in FIG. 3, and for clarity the passivating layer 17 is not shown, although the contact apertures through the the passivating layer 17 are indicated by broken lines. Further, the portions of the P-N junctions of the resistor structure adjacent to the surface 16 of the semiconductor are indicated by chain-dotted lines. The buried layer 12 is not indicated. The contacts of the resistor structure are shown by continuous lines. The connection 19 between the resistor structure and the collector contact 18' of the transistor T1 is not shown in FIG. 3.

The resistor structure has the inner N+ type region 30, within the region 11' defined by the combination of regions 12, 14, of the component, and comprising the resistive material of the structure. Further, as shown only in FIG. 3, the inner region 30 has a zig-zag form in plan, there being enlarged end portions 30' for contacts 31. In FIG. 2 the inner region 30 is indicated only generally, and only one contact 31, connected to the connection 19 to the base of the transistor T1, is shown.

The potential source 10", having an output of −5 volts, is connected to a contact 10' on the substrate 10 of the device.

As indicated only in FIG. 2, the contact 31 remote from the connection 19 to the transistor T1, and which remote contact is not shown in FIG. 2, is maintained at a potential level of +5 volts by being connected to a potential source 31" via a connection 31'.

Because contacts are not provided for the combination of regions 12, 14, and the unmodified P-type region 11', these regions are floating.

In the operation of the device of FIG. 2 a potential difference of upto substantially twice the breakdown potential difference of the outer P-N junction 14', and at least of 10 volts, can be applied between any portion of the inner N+ type region 30 comprising the resistive material, and the regions 10 and 11 of the device beyond the outer junction 14', without any P-N junction of the component breaking down.

The circuit arrangement is required to be such that no constituent component of the device breaks down when a potential difference of upto substantially twice the breakdown potential difference of the outer component P-N junction 14' is applied across the device.

In particular, within the circuit arrangement, the potential difference between the collector 12, 14 of the transistor T1 and the P-type regions of the device beyond the transistor T1, but contiguous with it, is less than the potential difference applied across the construction of the resistor structure, and is less than 10 volts, for example, being less than 8 volts.

The resistor structure of FIGS. 2 and 3 differs from a resistor comprising a CDI-type component of the known construction, the resistive material of the latter component comprising the unmodified P-type epitaxial material 11'. Because the resistive material of the resistor structure of FIGS. 2 and 3 is of lower resistivity value it is larger in plan than the resistor comprising a CDI-type component of the known construction, but is also advantageous in that it has a lower resistance-temperature coefficient.

It is essential to arrange that the potential difference within the resistive material 30 of the resistor structure, in the operation of the device, is not so large that the P-N junction defining the resistive material breaks down i.e., the potential difference being the breakdown potential difference of this P-N junction. For this, or other reasons, it may be required to connect several such resistor structures in series with each other within the device.

The resistor structure may be varied in several different ways.

In FIG. 2A a contact 32 is provided to the combination of regions 12, 14 of the structure, and the contact 32 is maintained at zero potential by being connected to a potential source 32" via a connection 32'.

In FIG. 2B a contact 33 is provided to the region 11' defined by the combination of regions 12, 14 of the structure, and the contact 33 is maintained at zero potential by being connected to a potential source 33" via a connection 33'.

Thus, in either of the arrangements of FIG. 1A and FIG. 1B one of the two constituent parts of the resistor structure comprising the combination of regions 12, 14, and the region 11' defined by the combination of regions, is maintained at a predetermined potential level, substantially mid-way between the potential level of +5 volts of the contact 31 connected to the potential source 31", and the potential level of −5 volts of the P-type regions 10, 11 of the device beyond the resistor structure, and contiguous with the outer P-N junction 14' serving partially to define the combination of regions 12, 14 of the resistor structure. In either arrangement, the constituent part of the device, of said two constituent parts of the device, not maintained at a predetermined potential level, is floating.

As shown in FIG. 2C a contact 34 is provided to the region 11' defined by the combination of regions 12, 14 of the structure, and the contact 34 is maintained at a potential level of +1.5 volts by being connected to a potential source 34" via a connection 34', and a contact 35 is provided to the combination of regions 12, 14, and is maintained at a potential level of −1.5 volts by being connected to a potential source 35" via a connection 35'.

As shown in FIGS. 2D and 2E a contact 36 is provided to both the combination of regions 12, 14 and to the region 11' defined by the combination of regions, of the structure, the contact 36 spanning a surface portion of the P-N junction between the regions, and so that the combination of regions and the region 11' are at the same potential level. Thus, parasitic four layer action within the structure is prevented. As shown in FIG. 2D the contact 36 is maintained at zero potential by being connected to a potential source 36" via a connection 36'. The contact 36 is shown in FIG. 2E as not being connected to a potential source, and in this circuit arrangement the combination of regions 12, 14, and the region 11', are considered to be floating. A connection may be provided between the combination of regions 12, 14, and the region 11', other than by providing a contact spanning a surface portion of the P-N junction therebetween.

In any such arrangement it is required that the potential level of at least one of the two constituent parts of the resistor structure comprising the combination of regions 12, 14, and the region 11' defined by the combination of regions, is intermediate between the potential level of +5 volts of the contact 31 connected to the potential source 31", and the potential level of −5 volts of the P type regions 10 and 11 of the device beyond the resistor structure, and contiguous with the outer P-N junction 14' serving partially to define the combination of regions 12, 14 of the resistor structure.

The device may have more than the illustrated components, and possibly more than one CDI-type high-voltage breakdown component. A provided CDI-type high-voltage breakdown component may be operably coupled to, and possibly not directly connected to, more than one other CDI-type component of the device. The CDI-type high-voltage breakdown component may not be operably coupled to a CDI bipolar transistor, but to any other form of CDI-type device.

According to another aspect the present invention comprises a device of any one of the possible constructions referred to above with reference to FIG. 2.

Yet a further embodiment of a circuit arrangement according to the present invention is possible, which circuit arrangement is partially embodied in a semiconductor device, and the device is shown partially in FIG. 4. Parts of the device of FIG. 4 identical with, or closely resembling, parts of the device of FIG. 1, or FIG. 2, are identified by the same reference numerals in FIG. 4 as in FIG. 1, or FIG. 2.

In this circuit arrangement the CDI bipolar transistor T1 is connected to another CDI bipolar transistor T2, of the known construction, but the transistor T2 is arranged to operate in the inverse mode. The transistor T2 comprises a CDI-type, high-voltage breakdown component of the device. The emitter 15 of the transistor T2 (when considered in the forward mode) is connected to a resistor structure, comprising the resistor structure shown in FIGS. 2 and 3, via a connection 19. The resistor structure may be of any one of the variants shown in FIG. 2. A potential of +5 volts is applied to the contact 31 of the resistor structure remote from the transistor T2. The collector contact 18' of the transistor T2 is connected to the collector contact 18' of the transistor T1 via a connection 19. A suitable potential is applied to the collector contact 18', and to the base contact 18", of the transistor T1 to ensure that the transistor T2 operates in the inverse mode. The potential source 10", having an output of −5 volts, is connected to the contact 10' on the substrate 10 of the device.

In the operation of the circuit arrangement, and especially when the transistor T2 is not conducting, the emitter 15 of the transistor T2 can be at a potential level of +5 volts.

It is required that the potential level of at least one of the base or collector of the transistor T2 is intermediate between the potential level of +5 volts of the emitter, and the potential level of −5 volts of the P type regions 10 and 11 of the device beyond the transistor T2, and contiguous with the outer P-N junction 14' serving partially to define the collector 12, 14.

Within any CDI bipolar transistor, and in the operation of such a transistor, breakdown normally occurs from the emitter to the base, and from the collector to the regions of the device beyond the transistor and contiguous with the transistor, including the substrate of the semiconductor body.

However, because the CDI bipolar transistor T2 is operating in the inverse mode the potential level of the emitter, acting as the collector, conveniently, may have a higher value in relation to the potential level of the substrate of the semiconductor body than when operating in the forward mode.

The advantage of employing a CDI bipolar transistor in such a circuit arrangement is that the transistor has a high inverse current gain factor, greater than 10.

The circuit arrangement is such that the transistor T2 does not breakdown with a potential difference upto substantially twice the breakdown potential difference of the outer P-N junction 14' of the transistor collector 12, 14 applied across the construction of the transistor T2. In particular, no constituent P-N junction of the transistor T2 breaks down.

Further, in operation, the circuit arrangement is required to be such that the device does not breakdown when a potential difference upto substantially twice the breakdown potential difference of the outer P-N junction 14' of each constituent CDI-type component of the device is applied across the device.

In particular, within the circuit arrangement, the potential difference between the collector 12, 14 of the transistor T1 and the P type regions of the device beyond the transistor T1, but contiguous with it, is less than the potential difference across the construction of the transistor T2, and is less than 10 volts, for example, being less than 8 volts.

The suitable potential levels applied to the collector 12, 14, and to the base 11' of the transistor T2, and to the emitter 15, and the base 11' of the transistor T1, may be applied by potential sources (not shown) of the circuit arrangement, or because the transistors T1 and T2 are operably coupled to other components of the device.

The provision of the resistor is not essential, but its presence is desirable to reduce the potential level applied to the emitter, and to reduce breakdown sustaining currents.

The resistor may be external of the semiconductor body, and may have any convenient form.

As indicated above, the device may have more than the components illustrated. The CDI transistor T2 may be operably coupled to, and possibly not directly connected to, more than one other CDI-type component of the device, and may not be operably coupled to a CDI bipolar transistor.

Another circuit arrangement according to the present invention is partially embodied in the device shown in part in FIG. 5, and comprises yet another embodiment according to the present invention. Parts of the device of FIG. 5 identical with, or closely resembling parts of the device of FIG. 1, are identified by the same reference numerals in FIG. 5 as in FIG. 1.

In this device the contact structure of FIG. 1 is replaced by a contact structure comprising a CDI-type component, but only having one contact 40, the contact 40 being directly connected to the inner region 15 of the structure. Thus, the structure comprises a CDI-type high-voltage breakdown component, and comprises a modification of a CDI-type component of the known construction.

The contact 40 is maintained at a potential level of +5 volts by being connected to a potential source 40" via a connection 40'. The region 11', and the combination of regions 12, 14, of the structure are considered to be floating. The potential source 10", having an output of −5 volts, is connected to the contact 10" on the substrate 10 of the device.

A potential difference, of at least 10 volts, and upto substantially twice the breakdown potential difference of the outer P-N junction 14' can be applied between the inner region 15 of the component and the regions 10 and 11 of the device beyond the component, but contiguous with the component.

In particular, no constituent P-N junction of the contact structure breaksdown.

The circuit arrangement is required to be such that no constituent component of the device breaks down when a potential difference of upto substantially twice the breakdown potential difference of the outer component P-N junction 14' is applied across the device.

In particular, within the circuit arrangement, the potential difference between the collector 12, 14 of the transistor T1 and the P-type regions of the device beyond the transistor T1, but contiguous with it, is less than the potential difference applied across the construction of the contact structure, and is less than 10 volts, for example, being less than 8 volts.

It is required that the potential level of at least one of the regions 11' and the combination of regions 12, 14 of the contact structure is intermediate between the potential level of +5 volts of the contact 40, and the potential level of −5 volts of the P type regions 10 and 11 of the device contiguous with the contact structure.

The device may have more than the components illustrated. The contact structure may be operable coupled to, and possibly not directly connected to, more than one other CDI-type component of the device, and may not be operably coupled to a CDI bipolar transistor.

According to another aspect the present invention comprises a device of any one of the possible constructions referred to above with reference to FIG. 5.

In a semiconductor body of a device in accordance with the present invention the thin layer in which the CDI-type components are provided may not be an epitaxial layer. Further, the P-type region defined by the combination of the buried layer and the isolation barrier may not be of unmodified material of the thin layer.

It will be understood that the conductivity types of the regions of the semiconductor devices described above may be reversed.

What I claim is:

1. A circuit arrangement, at least partially embodied in a semiconductor device, in a semiconductor body comprising a thin layer initially wholly of one conductivity type on a substrate of the same conductivity type, the device having a plurality of components, at least one component having a combination of regions comprising a buried layer of the opposite conductivity type at a portion of the interface between the thin layer and the substrate, and an isolation barrier of the opposite conductivity type for the component, the isolation barrier extending through the thin layer to the buried layer, and an inner region of the opposite conductivity type within a region of said one conductivity type defined by the combination of regions, the inner region being adjacent to the surface of the thin layer remote from the substrate and being spaced from the combination of regions, and at least one contact provided on said surface of the semiconductor body, said at least one contact overlying the inner region of the opposite conductivity type, and said at least one component is operably coupled to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, within the device said at least one component and said at least one other component being spaced from each other within the thin layer, and being substantially electrically isolated from each other within the semiconductor body by regions of the device, of said one conductivity type, and beyond each such component, but contiguous with the outer P-N juncton of the combination of regions of each such component, and the circuit arrangement including means to maintain at least two spaced points of the device at different potential levels, the circuit arrangement being such that a larger, predetermined potential difference is applied between said at least one contact of said at least one component, and the regions of the device beyond, and contiguous with, said at least one component, compared with the potential difference provided between the combination of the buried layer and the isolation barrier of said at least one other component operable coupled to said at least one component, and the regions of the device beyond, and contiguous with, said at least one other component.

2. A circuit arrangement as claimed in claim 1 in which means is provided whereby the combination of regions, and the region of said one conductivity type defined by the combination of regions, of said at least one component, can be at different potential levels, and said at least one component comprises a bipolar transistor having a high inverse current gain factor, greater than 10, the circuit arrangement being such that the bipolar transistor operates in the inverse mode.

3. A circuit arrangement as claimed in claim 2 in which a resistor is provided in series with the emitter of the bipolar transistor.

4. A circuit arrangement as claimed in claim 1 in which said at least one component comprises a contact structure including a metal layer extending wholly on a layer of passivating material on said surface of the semiconductor body, and overlying the inner region of the opposite conductivity type.

5. A circuit arrangement as claimed in claim 4 in which means is provided whereby the combination of regions, and the region of said one conductivity type defined by the combination of regions, of said at least one component, are maintained at different potential levels.

6. A circuit arrangement as claimed in claim 4 in which means is provided whereby only said contact structure is maintained at a predetermined potential level, the potential level of the combination of regions, and of the region of said one conductivity type defined by the combination of regions, of said at least one component, being considered to be floating.

7. A circuit arrangement as claimed in claim 4 in which means is provided whereby only one of the combination of regions, and the region of said one conductivity type defined by the combination of regions, of said at least one component, is maintained at a predetermined potential level.

8. A circuit arrangement as claimed in claim 7 in which said predetermined potential level is substantially mid-way between the potential level of the metal layer of said contact structure, and the potential level of the regions of the device beyond, and contiguous with, said at least one component.

9. A circuit arrangement as claimed in claim 4 in which a connection is provided between the combination of regions, and the region of said one conductivity type defined by the combination of regions, of said at least one component, so that the component parts connected together are at a common potential level.

10. A circuit arrangement as claimed in claim 9 in which the connection comprises a contact spanning a surface portion of the P-N junction between the combination of regions and the region of said one conductivity type defined by the combination of regions, of said at least one component.

11. A circuit arrangement as claimed in claim 10 in which the contact spanning a surface portion of the P-N junction is maintained at a predetermined potential level.

12. A circuit arrangement as claimed in claim 1 having said at least one component comprising a resistor structure, the resistive material of which structure comprises the inner region of the opposite conductivity type, and two contacts are provided to opposing ends of this region.

13. A circuit arrangement as claimed in claim 12 in which the inner resistive region of the opposite conductivity type of said at least one component has a zig-zag form when the device is considered in plan.

14. A circuit arrangement as claimed in claim 12 in which means is provided whereby the combination of regions, and the region of said one conductivity type defined by the combination of regions, of said at least one component, are maintained at different potential levels.

15. A circuit arrangement as claimed in claim 12 in which means is provided where only the contact at one end of the resistor structure is maintained at a predetermined potential level, the potential level of the combination of regions, and of the region of said one conductivity type defined by the combination of regions, of said at least one component, being considered to be floating.

16. A circuit arrangement as claimed in claim 12 in which means is provided whereby only one of the combination of regions, and the region of said one conductivity type defined by the combination of regions, of said at least one component, is maintained at a predetermined potential level.

17. A circuit arrangement as claimed in claim 16 in which said predetermined potential level is substantially mid-way between the potential level of a contact at one end of the resistor structure, and comprising said at least one contact of said at least one component, and the potential level of the regions of the device beyond, and contiguous with, said at least one component.

18. A circuit arrangement as claimed in claim 12 in which a connection is provided between the combination of regions, and the region of said one conductivity type defined by the combination of regions, of said at least one component, so that the component parts connected together are at a common potential level.

19. A circuit arrangement as claimed in claim 18 in which the connection comprises a contact spanning a surface portion of the P-N junction between the combination of regions and the region of said one conductivity type defined by the combination of regions, of said at least one component.

20. A circuit arrangement as claimed in claim 19 in which the contact spanning a surface portion of the P-N junction is maintained at a predetermined potential level.

21. A circuit arrangement as claimed in claim 1 in which said at least one component has only one contact, said one contact being in contact with the inner region of the opposite conductivity type, and means is provided whereby said one contact is maintained at a predetermined potential level, the potential level of the combination of regions, and of the region of said one conductivity type defined by the combination of regions, of said at least one component, being considered to be floating.

22. A circuit arrangement as claimed in claim 1 in which the means to maintain at least two spaced points of the device at different potential levels includes a contact to the substrate of the semiconductor body, and said at least one contact of said at least one component.

23. A circuit arrangement as claimed in claim 1 in which a heavily doped portion of said one conductivity type is provided, adjacent to the surface of the thin layer remote from the substrate, in each region of the device within the thin layer, and of said one conductivity type.

24. A circuit arrangement as claimed in claim 1 in which the thin layer of the semiconductor body is an epitaxial layer.

25. A semiconductor device, in a semiconductor body comprising a thin layer initially wholly of one conductivity type on a substrate of the same conductivity type, the device having a plurality of components, at least one component having a combination f regions comprising a buried layer of the opposite conductivity type at a portion of the interface between the thin layer and the substrate, and an isolation barrier of the opposite conductivity type for the component, the isolation barrier extending through the thin layer to the buried layer, and an inner region of the opposite conductivity type within a region of said one conductivity type defined by the combination of regions, the inner region being adjacent to the surface of the thin layer remote from the substrate and being spaced from the combination of regions, and only one contact, said one contact being in contact with the inner region of the opposite conductivity type, and said at least one component is operably coupled to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, within the device said at least one component and said at least one other component being spaced from each other within the thin layer, and being substantially electrically isolated from each other within the semiconductor body by regions of the device, of said one conductivity type, and beyond each such component, but contiguous with the outer P-N junction of the combination of regions of each such component.

26. A semiconductor device as claimed in claim 25 in which a heavily doped portion of said one conductivity type is provided, adjacent to the surface of the thin layer remote from the substrate, in each region of the device within the thin layer, and of said one conductivity type.

27. A semiconductor device as claimed in claim 25 in which the thin layer of the semiconductor body is an epitaxial layer.

28. A semiconductor device, in a semiconductor body comprising a thin layer initially wholly of one conductivity type on a substrate of the same conductivity type, the device having a plurality of components, at least one component having a combination of regions comprising a buried layer of the opposite conductivity type at a portion of the interface between the thin layer and the substrate, and an isolation barrier of the opposite conductivity type for the component, the isolation barrier extending through the thin layer to the buried layer, and an inner region of the opposite conductivity type within a region of said one conductivity type defined by the combination of regions, the inner region being adjacent to the surface of the thin layer remote from the substrate and being spaced from the combination of regions, and a contact structure including a metal layer extending wholly on a layer of passivating material on said surface of the semiconductor body, and overlying the inner region of the opposite conductivity type, is provided, and said at least one component is operably coupled to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, within the device said at least one component and said at least one other component being spaced from each other within the thin layer, and being substantially electrically isolated from each other within the semiconductor body by regions of the device, of said one conductivity type, and beyond each such component, but contiguous with the outer P-N junction of the combination of regions of each such component.

29. A semiconductor device as claimed in claim 28 in which a contact is provided on one of the constituent parts of said at least one component of the device comprising the combination of regions, and the region of said one conductivity type defined by the combination of regions.

30. A semiconductor device as claimed in claim 28 in which a contact is provided on the combination of regions, and another contact is provided on the region of said one conductivity type defined by the combination of regions, of said at least one component of the device.

31. A semiconductor device as claimed in claim 28 in which a contact is provided to span a surface portion of the P-N junction between the combination of regions and the region of said one conductivity type defined by the combination of regions.

32. A semiconductor device as claimed in claim 28 in which a heavily doped portion of said one conductivity type is provided, adjacent to the surface of the thin layer remote from the substrate, in each region of the device within the thin layer, and of said one conductivity type.

33. A semiconductor device as claimed in claim 25 in which the thin layer of the semiconductor body is an epitaxial layer.

34. A semiconductor device, in a semiconductor body comprising a thin layer initially wholly of one conductivity type on a substrate of the same conductivity type, the device having a plurality of components, at least one component having a combination of regions comprising a buried layer of the opposite conductivity type at a portion of the interface between the thin layer and the substrate, and an isolation barrier of the opposite conductivity type for the component, the isolation barrier extending through the thin layer to the buried layer, and an inner region of the opposite conductivity type within a region of said one conductivity type defined by the combination of regions, the inner region being adjacent to the surface of the thin layer remote from the substrate and being spaced from the combination of regions, and the inner region of the opposite conductivity type comprises resistive material of a resistor structure, two contacts being provided to opposing ends of this region, and said at least one component is operably coupled to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, within the device said at least one component and said at least one other component being spaced from each other within the thin layer, and being substantially electrically isolated from each other with in the semiconductor body by regions of the device, of said one conductivity type, and beyond each such component, but contiguous with the outer P-N junction of the combination of regions of each such component.

35. A semiconductor device as claimed in claim 34 in which the inner resistive region of the opposite conductivity type of said at least one component has a zig-zag form when the device is considered in plan.

36. A semiconductor device as claimed in claim 34 in which a contact is provided on one of the constituent parts of said at least one component of the device comprising the combination of regions, and the region of said one conductivity type defined by the combination of regions.

37. A semiconductor device as claimed in claim 34 in which a contact is provided on the combination of regions, and another contact is provided on the region of said one conductivity type defined by the combination of regions, of said at least one component of the device.

38. A semiconductor device as claimed in claim 34 in which a contact is provided to span a surface portion of the P-N junction between the combination of regions and the region of said one conductivity type defined by the combination of regions.

39. A semiconductor device as claimed in claim 34 in which a heavily doped portion of said one conductivity type is provided, adjacent to the surface of the thin layer remote from the substrate, in each region of the device within the thin layer, and of said one conductivity type.

40. A semiconductor device as claimed in claim 34 in which the thin layer of the semiconductor body is an epitaxial layer.

* * * * *

UNITED STATES PATENT AND TRADEMARK OFFICE
CERTIFICATE OF CORRECTION

PATENT NO. : 4,134,124
DATED : Jan. 9, 1979
INVENTOR(S) : Jeffrey Kane

It is certified that error appears in the above–identified patent and that said Letters Patent are hereby corrected as shown below:

```
Cover sheet, after Item [22], insert
--[30] Foreign Application Priority Data
   November 27, 1976 Great Britain 49576/76--
```

Signed and Sealed this

Twenty-fourth Day of April 1979

[SEAL]

Attest:

RUTH C. MASON
Attesting Officer

DONALD W. BANNER
Commissioner of Patents and Trademarks